United States Patent [19]

Song

[11] Patent Number: 5,432,447
[45] Date of Patent: Jul. 11, 1995

[54] PHASE UNWRAPPING OF MR PHASE IMAGES USING POISSON EQUATION

[75] Inventor: Samuel M. Song, San Mateo, Calif.

[73] Assignee: Board of Trustees of the Leland Stanford Junior University, Palo Alto, Calif.

[21] Appl. No.: 107,476

[22] Filed: Aug. 11, 1993

[51] Int. Cl.6 .............................................. G01V 3/00
[52] U.S. Cl. .................................... 324/309; 324/307
[58] Field of Search ............... 324/300, 307, 309, 311, 324/312, 313, 318, 322

[56] References Cited

U.S. PATENT DOCUMENTS

| 4,797,615 | 1/1989 | Rotem et al. | 324/309 |
|---|---|---|---|
| 4,857,844 | 8/1989 | Van Vaals | 324/309 |
| 5,084,818 | 1/1992 | Machida | 324/309 |
| 5,184,073 | 2/1993 | Takeuchi et al. | 324/307 |

OTHER PUBLICATIONS

Song et al., "Phase Unwrapping of MR Phase Images Using Poisson Equation", Society of Magnetic Resonance in Medicine, Aug. 14, 1993, pp. 1–27.
Song et al., "Dynamic Range Extension of Phase Contrast Velocity Measurements", 1993 Abstract Form for Society of Magnetic Resonance in Medicine 12th Annual Soc. Mtg., Aug. 14–20, 1993.
Mertz, "Speckle Imaging, Photon by Photon", Applied Optics, vol. 19, No. 5, 1 Mar. 1979, pp. 611–614.
Itoh, "Analysis of the Phase Unwrapping Algorithm", Applied Optics, vol. 21, No. 14, 15 Jul. 1982, p. 2470.
Goldstein et al., "Satellite Radar Interferometry: Two-Dimensional Phase Unwrapping", Radio Science, vol. 23, No. 4, pp. 713–720, Jul.–Aug. 1988.
Hedley et al., "A New Two-Dimensional Phase Unwrapping Algorithm for MRI Images", Magnetic Resonance in Medicine, vol. 24, pp. 177–181, 1992.
Axel et al., "Correction of Phase Wrapping in Magnetic Resonance Imaging", Medical Physics, vol. 16, No. 2, Mar./Apr. 1989, pp. 284–287.
Ghiglia et al., "Direct Phase Estimation From Phase Differences Using Fast Elliptic Partial Differential Equation Solvers", Optics Letter, vol. 14, No. 20, Oct. 15, 1989, pp. 1107–1109.
Takajo et al., "Least-Squares Phase Estimation From the Phase Difference", J. Opt. Soc. Am. A., vol. 5, No. 3, Mar. 1988, pp. 416–425.

Primary Examiner—Louis Arana
Attorney, Agent, or Firm—Townsend and Townsend Khourie and Crew

[57] ABSTRACT

Disclosed is a phase unwrapping technique based on the solution of the Poisson equation. The problem of phase unwrapping in the continuous domain is formulated using an optimization approach where a cost functional is minimized. The minimizer is shown to be a solution of the Poisson equation with an appropriate boundary condition; the choice of the boundary condition depends on the particular application. The solution to the Poisson equation, i.e., the phase that minimizes the cost functional is referred to as the least squares phase. The least squares phase has thereby been unwrapped but, in general, will differ from the absolute phase due to noise. Using the least squares phase, the absolute phase is finally determined with an operator that maps the least squares phase to the absolute phase so that the computed absolute phase and the measured phase differ by multiples of $2\pi$.

18 Claims, 6 Drawing Sheets

PHASE UNWRAPPING OF MR PHASE IMAGES USING POISSON EQUATION

BACKGROUND OF THE INVENTION

This invention relates generally to phase measurements of signals such as Magnetic Resonance Imaging (MRI) signals, and more particularly the invention relates to determining the absolute phase of a signal given its principal value.

Nuclear magnetic resonance (NMR) imaging, also called magnetic resonance imaging (MRI), is a nondestructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radiofrequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = Z \cdot G_z$, on the static uniform field, $B_0$, which defined Z axis, for example, nuclei in a selected X–Y plane can be excited by proper choice of the frequency spectrum of the transverse excitation field applied along the X or Y axis. Similarly, a gradient field can be applied in the X–Y plane during detection of the FID signals to spatially localize the FID signals in the plane. The angle of nuclei spin flip in response to an RF pulse excitation is proportional to the integral of the pulse over time.

Phase unwrapping is the process of determining the absolute phase given its principal value. This seemingly simple task is made difficult by the presence of measurement noise and has been analyzed for many different applications, ranging from homomorphic signal processing to speckle imaging, and recently for magnetic resonance imaging (MRI).

The MR phase can be designed to be a measure of some physical quantity. Depending on the pulse sequence, the MR phase can represent the main $B_0$ field inhomogeneity or can be proportional to the velocity of the moving spins. Phase unwrapping is a necessary tool for the three-point Dixon water and fat separation and can be used to increase the dynamic range of phase contrast MR velocity measurements. In this paper, we propose a phase unwrapping technique based on the solution of the Poisson equation and apply the algorithm to MR phase images.

Various disciplines require reliable phase unwrapping algorithms. Homomorphic signals processing, where a nonlinear processing is achieved by linear operations in the complex cepstral frequency domain, requires computation of the complex cepstrum. The cepstrum necessitates a continuous imaginary part of the logarithm (phase of the spectrum). Since the imaginary part of the logarithm is only available modulo $2\pi$, the phase must be unwrapped prior to the Fourier transform. In a similar manner, inverse scattering algorithms based on the Rytov approximation require phase unwrapping to determine the imaginary part of the logarithm. Other applications of phase unwrapping can be found in interference pattern analysis and image restoration.

In speckle imaging, unwrapping the phase of the Fourier transform is required prior to averaging. In this application, the phase has been unwrapped simply by integrating the wrapped phase derivative. Although simple, this method is extremely sensitive to noise. Moreover, a noise spike introduced early on will remain throughout this phase tracking process.

In signal processing applications, it is typically desired to unwrap the phase of the Fourier transform, e.g., for the cepstral computation mentioned above. For this purpose, various 1-D phase unwrapping algorithms have been proposed: adaptive integration of the phase derivative, counting sign changes in a Strum sequence, using zero locations of a band-limited function, detecting a zero's crossing of the unit circle, and using a discrete optimal nonlinear filtering technique. Although extensions of these algorithms to 2-D are possible, for instance, by unwrapping a 2-D signal along a prescribed path, the algorithms are 1-D in nature. One-dimensional algorithms extended to 2-D only make use of the phase values of the neighbors that lie on a (1-D) path—other neighbors are ignored.

The limitations of 1-D phase unwrapping algorithms extended to 2-D are due to the fact that the measurement noise can cause the result to depend on the chosen path. This point has been discussed using the idea of branch cuts. It is known that branch cuts can be placed so that phase unwrapping along any path without crossing the branch cut will be path independent. Since there can be a large number of such branch cuts, the set of branch cuts with the shortest total length can be used to unwrap the phase. However, this shortest length solution is heuristic and cannot be valid for general applications.

The idea of computing the least squares phase given measurements of the principal values has been described. The least squares phase can be obtained by using an iterative algorithm. The use of a direct algorithm for computing the least square phase was proposed where the algorithm derived in the discrete domain can be viewed as a discretization of the Poisson equation.

SUMMARY OF THE INVENTION

In accordance with the invention a phase unwrapping technique is based on the solution of the Poisson equation. I formulate the problem of phase unwrapping in the continuous domain using an optimization approach where a cost functional is minimized. The minimizer is shown to be a solution of the Poisson equation with an appropriate boundary condition; the choice of the boundary condition depends on the particular application. The solution to the Poisson equation, i.e., the phase that minimizes the cost functional is referred to as the least squares phase. The least squares phase has thereby been unwrapped but, in general, will differ from the absolute phase due to noise. Using the least squares phase, the absolute phase is finally determined with an operator that maps the least squares phase to the absolute phase so that the computed absolute phase and the measured phase differ by multiples of $2\pi$.

The invention and objects and features thereof will be more fully understood from the following detailed description and appended claims when taken with the drawings.

DETAILED DESCRIPTION OF ILLUSTRATIVE EMBODIMENTS

Figure 1A:
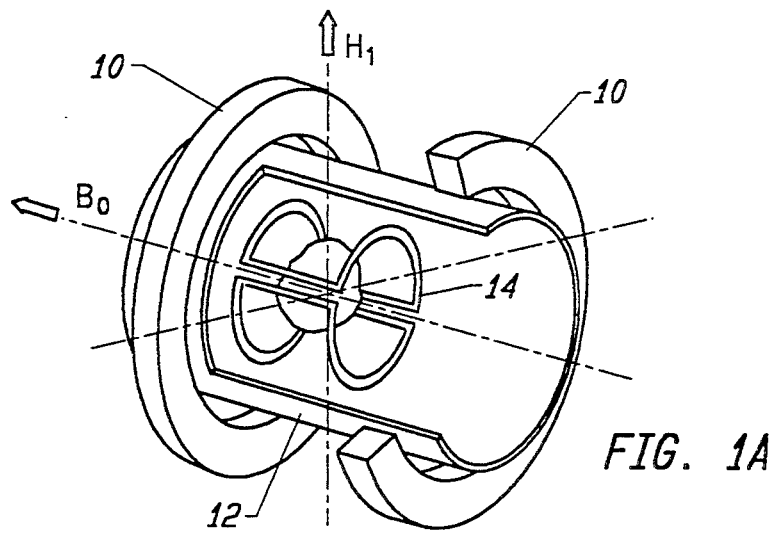
FIGS. 1(a)-1(d) illustrate the arrangement of MRI apparatus and magnetic fields generated therein.
Figures 1B, 1C, 1D:
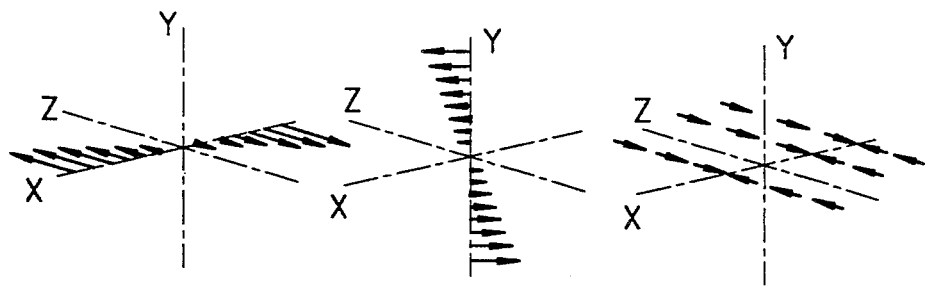

Referring now to the drawing, FIG. 1(a) is a perspective view partially in section illustrating coil apparatus in NMR imaging system, and FIGS. 1(b)-1(d) illustrate field gradients which can be produced in the apparatus of FIG. 1(a). This apparatus is discussed by Hinshaw and Lent, "An Introduction to NMR Imaging: From the Block Equation to the Imaging Equation," Proceedings of the IEEE, Vol. 71, No. 3, March 1983, pp. 338-350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the Z axis within the saddle coil 14.

In FIG. 1(b) an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
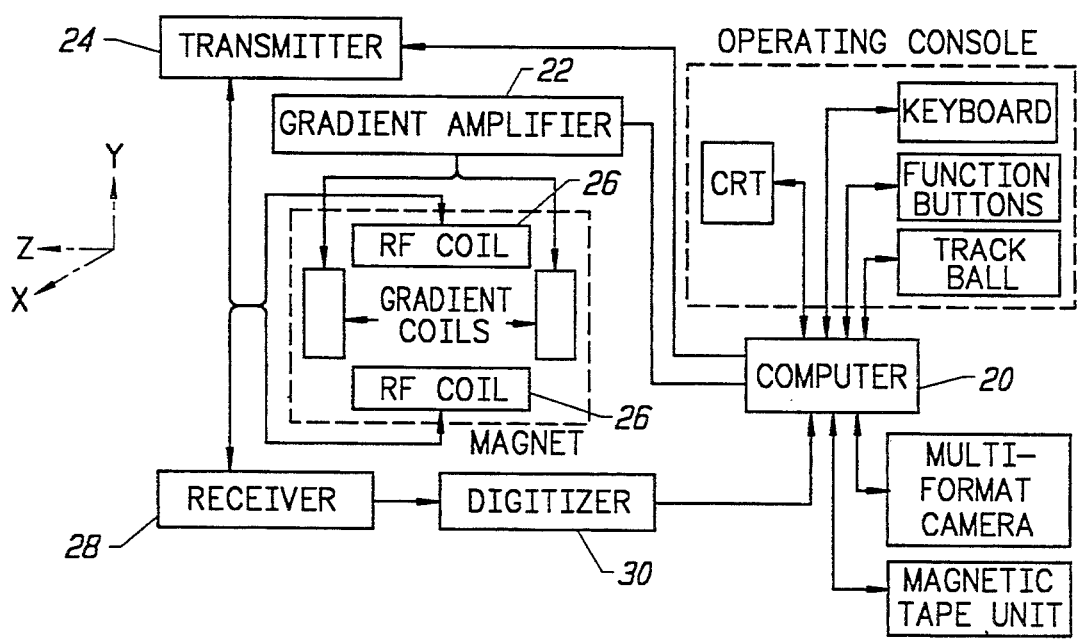
FIG. 2 is a functional block diagram of MR imaging apparatus.

FIG. 2 is a functional block diagram of the imaging apparatus as disclosed in NMR-A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
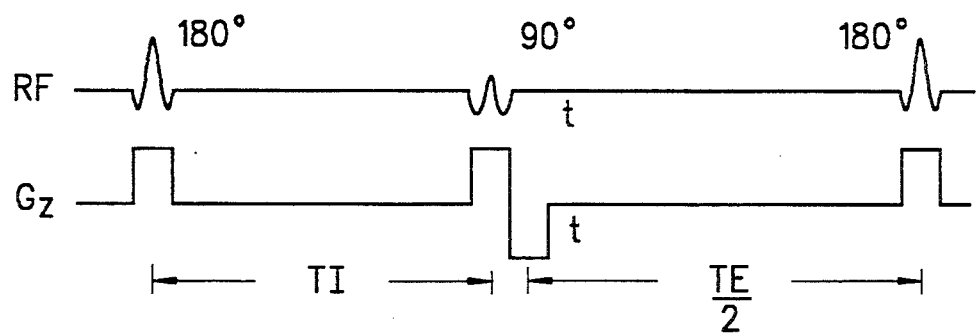
FIG. 3 illustrates a basic pulse sequence for exciting a slab for projection image.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

Consider now the problem of computing the least squares phase, given a wrapped noisy measurement of the true phase. Mathematically, the true phase $\phi$ and the noisy measurement of its principal value $\psi$ are related by the measurement equation:

$$\Psi(\tau) = \phi(\tau) + n(\tau) + 2\pi k(\tau) \text{ for all } \tau = (x,y,z) \in \Omega \quad (1)$$

where $n(\tau)$ denotes the measurement noise, $k(\tau)$ is an integer such that $-\pi \leq \psi(\tau) < \pi$, and $\Omega$ is the imaging volume. The above can be expressed more compactly by using the phase wrapping operator W:

$$\psi = W[\phi + n]$$

where we have dropped $\tau$ for notational convenience. The definition of W follows from (1). Thus, given $W[\phi + n]$, we wish to determine $\phi + n$.

For a nominal MR data acquisition scheme, the phase is expected to vary slowly. Otherwise, the mutual interference of isochromats within an imaging voxel can result in near-zero net signal. Therefore, it is reasonable to assume:

$$\left| \frac{\phi(\tau + (\Delta x, 0, 0)) - \phi(\tau)}{\Delta x} \right| < \frac{\pi}{L_x} \quad (2)$$

where as indicated, $(\Delta x, 0, 0)$ is a small displacement in the direction of the x-axis and $L_x$ is the unit length along the x-axis, for instance, the voxel dimension in the x-axis. Without loss of generality, the unit length is normalized to one, i.e., $L_x = 1$. By repeating the above with the y and z-axis, with normalized lengths, $L_y = L_z = 1$, and taking the limit as $(\Delta x, \Delta y, \Delta z) \to (0,0,0)$, we have:

$$|\nabla \phi| < (\pi, \pi, \pi) \quad (3)$$

By contrast, the gradient of the measured phase $\psi$ at the location of a phase wrap is large.

Suppose $\psi$ is measured perfectly, with zero noise ($n(\tau) = 0$). In this case, given that (3) holds, the wrapped gradient of the measured phase, $W[\nabla \psi]$, will be identically equal to the gradient of the true phase, $\nabla \phi$. Therefore, to recover $\psi$, $W[\nabla \psi]$ may be integrated along some path covering the imaging volume $\Omega$. This method is referred to as phase tracking and unfortunately, this is only applicable for high SNR images. Even though (3) may hold, the phase tracking method requires that $$|\nabla(\phi + n)| < (\pi, \pi, \pi) \quad (4)$$

when noise is present. If (4) holds, the phase recovered by phase tracking will be $\phi+n$, the desired unwrapped phase.

In regions of low SNR, condition (4) is expected to break down as the measured phase $\psi(\tau)$ will be dominated by the phase noise $n(\tau)$. As noise is an unavoidable part of any real data acquisition process, (4) cannot be expected to hold throughout the imaging volume $\Omega$. Therefore, a robust algorithm that can cope with the measurement noise $n(\tau)$ must be developed.

As discussed earlier, in regions of high SNR, the gradient of the absolute phase, $\nabla(\phi+n)$, is expected to be equal to $W[\nabla\psi]$, i.e., $$\nabla(\phi+n) = W[\nabla\psi] \tag{5}$$

However, in regions of low SNR, the equality sign holds only up to a multiple of $2\pi$.

This calls for a least squares type of an approach where we minimize:

$$\|\nabla\phi - W[\nabla\psi]\|_2^2 \tag{6}$$

The minimizer of the above will be referred to as the least squares phase $\phi_{LS}$. The minimizer of (6) can be characterized by the following Poisson equation:

$$\nabla^2\phi = \nabla \cdot W[\nabla\psi] \text{ on } \Omega \tag{7}$$

with an appropriate boundary condition that depends on the particular application.

Suppose the value of $\phi$ is known on the surface enclosing the imaging volume $\Omega$, i.e., $\partial\Omega$. For instance, the user has indicated a region of interest (ROI) and there are no phase wraps on the boundary of the ROI. IN this case, we apply the Dirichlet boundary condition. On the other hand, if the normal component of $\nabla\phi$ is given on the boundary $\partial\Omega$, e.g., $\nabla\phi \cdot \eta = 0$, where $\eta$ is the outward normal vector on $\partial\Omega$, we apply the Neumann boundary condition. And, lastly, if nothing is known about $\phi$ on the boundary $\partial\Omega$, we apply the free boundary condition.

Due to large phase noise in regions of low SNR, a straightforward implementation of (7) yields a solution that is not acceptable. The solution becomes dominated by regions of low SNR where violation of (5) results in unnecessary phase wraps by the operation $W[\nabla\psi]$. Therefore, we develop a scheme to mask out the regions of low SNR in conjunction with solving (7) over a reduced region.

I define a consistent region as a subset of the imaging volume $\Omega$ where (5) holds. Let $\Omega_C$ be a consistent region. Then, $$\Omega_C = \{(x,y,z) \in \Omega : W[\nabla\psi] \text{ is a gradient}\}. \tag{8}$$

Thus, $\Omega_C$ is a region of $\Omega$ where the integration of $W[\nabla\omega]$ is path independent.

Unwrapping of the measured phase $\psi$ over $\Omega_C$ is trivial. A straightforward integration of $W[\nabla\psi]$ along any path covering $\Omega_C$, or the solution of (7) over $\Omega_C$ will result in a perfect phase unwrapping. However, determination of $\Omega_C$ is difficult due to a plethora of branch cuts in $\Omega$ to construct $\Omega_C$.

Nonetheless, analysis of the consistent region $\Omega_C$ offers some insight. If the image acquired consists of high SNR regions, the existence of a consistent region $\Omega_C$ is clear. Furthermore, by definition (of $\Omega_C$), there exists $\phi_C$ such that $$\nabla\phi_C = b_C \text{ on } \Omega_C \tag{9}$$

where $b_C = W[\nabla\psi] | \Omega_C$, the restriction of $W[\nabla\psi]$ to $\Omega_C$.

Therefore, $b_C$ is a gradient over $\Omega_C$ and the integration of $b_C$ within $\Omega_C$ must be path independent. Hence, by virtue of (9), for any $\tau_1, \tau_2 \in \Omega_C$, $$\int_{\tau_1}^{\tau_2} \nabla\phi_C ds = \phi_C(\tau_2) - \phi_C(\tau_1) \tag{10}$$

In addition, the path integral of any gradient over a closed curve is known to be zero:

$$\oint_\Gamma \nabla\phi_c \cdot t \, ds = 0 \tag{11}$$

where $\Gamma$ denotes an arbitrary closed path in $\Omega_C$, t denotes the unit tangent vector on $\Gamma$, and ds is the differential line element on $\Gamma$.

In particular, let $\tau_1, \tau_2, \tau_3, \tau_4 \in \Omega_C$ be four corners of the discrete $2 \times 2$ grid. Then, using (10) together with (11), we have:

$$0 = [\phi_C(\tau_1) - \phi_C(\tau_2)] + [\phi_C(\tau_2) - \phi_C(\tau_3)] + [\phi_C(\tau_3) - \phi_C(\tau_4)] + [\phi_C(\tau_4) - \phi_C(\tau_1)]$$

which can be associated with:

$$0 = [W[\psi(\tau_1) - \psi(\tau_2)] + W[\psi(\tau_2) - \psi(\tau_3)] + W[\psi(\tau_3) - \psi(\tau_4)] + W[\psi(\tau_4) - \psi(\tau_1)]. \tag{12}$$

Equation (12) can also be derived by assuming $\phi_C$ to be an integrable function, i.e., $\phi_{Cxy} = \phi_{Cyx}$.

Several phase unwrapping techniques have used (12) as the basis of their methods. Algorithms that rely mostly on (12) are necessarily heuristic since $\Omega_C$ cannot be determined using (12) alone. For my algorithm, (12) does not play a central role. Equation (12) is used, however, to describe the behavior of the least squares phase $\phi_{LS}$ given an inconsistent set of measurements.

To demonstrate the effects of noise, consider the following discrete phase image:

$$\begin{bmatrix} \cdot & \cdot & \cdot & \\ \cdot & \cdot & \cdot & \\ \cdot & \cdot & \cdot & \\ \ldots & 0 & 0 & 0 & \ldots \\ \ldots & 0^* & .5+\epsilon^* & 0^* & \ldots \\ \ldots & 0^* & -.5^* & 0^* & \ldots \\ \ldots & 0 & 0 & 0 & \ldots \\ \cdot & \cdot & \cdot & \\ \cdot & \cdot & \cdot & \\ \cdot & \cdot & \cdot & \end{bmatrix} \tag{13}$$

where the principal interval is normalized to $[-1,1]$. For a small $\epsilon$, if $\epsilon<0$, then the above phase image is consistent and the measured phase can be unwrapped with ease. A straightforward integration of $W[\nabla\psi]$ along any path results in a perfect phase unwrapping which in this case is identical to the measured phase above. However, for $\epsilon>0$, cells marked with a star (*) are members of $2 \times 2$ grids that violate (12).

Figure 4A:
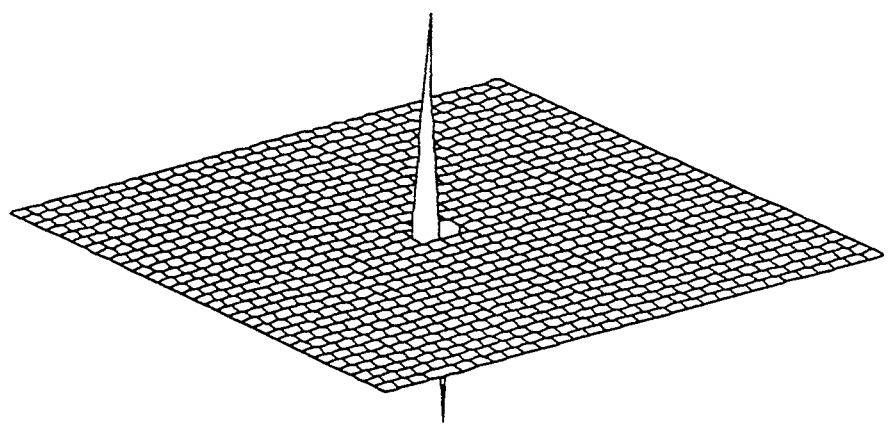
FIGS. 4(a)-4(c) are a demonstration of propagation of the impulsive phase noise including (a) original phase $\psi$, (b) least squares phase $\phi_{LS}$, and (c) the difference $\psi - \phi_{LS}$.
Figure 4B:
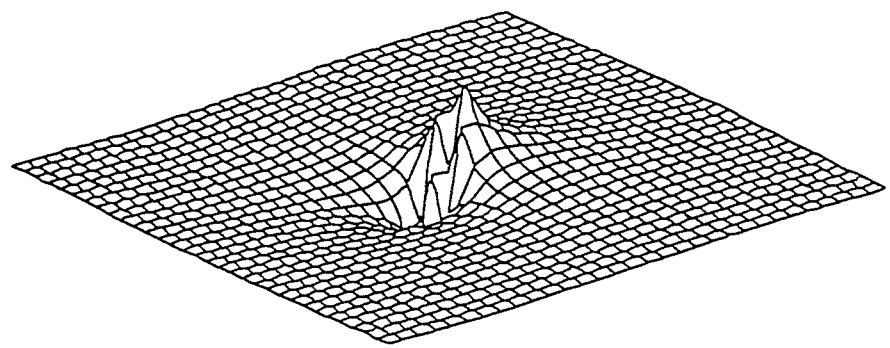
Figure 4C:
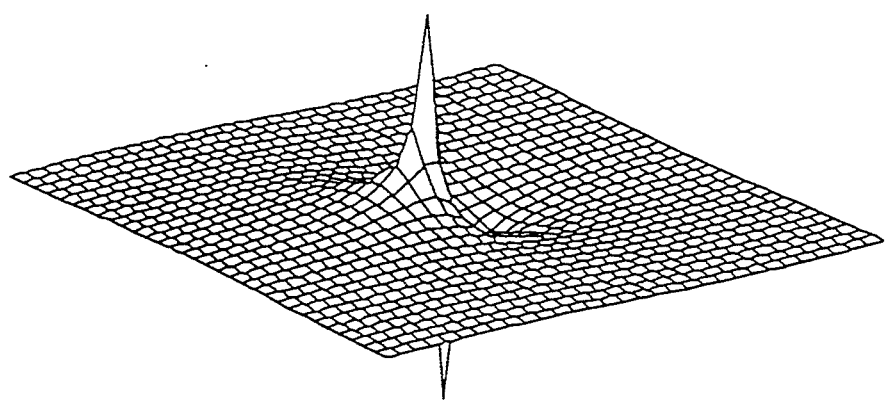
Figure 5A:
FIGS. 5(a)-5(d) illustrate unwrapping of in vivo MR phase image including (a) and (b) magnitude images at different window and level settings and (c) and (d) measured phase and unwrapped phase images.
Figure 5B:
Figure 5C:
Figure 5D:
Figure 6A:
FIGS. 6(a)-6(d) illustrate unwrapping of MR $B_0$ field map in vivo including (a) and (b) magnitude images at different window and level settings and (c) and (d) measured phase and unwrapped phase images.
Figure 6B:
Figure 6C:
Figure 6D:

The behavior of the least squares phase $\phi_{LS}$ given an inconsistent phase image can be studied with the above phase image with $\epsilon > 0$. I obtained the least squares phase $\phi_{LS}$ by solving the Poisson equation (7) with the above phase image with $\epsilon = 0.01$. FIG. 4(a) depicts the measured phase as shown above, (b) depicts the least squares phase and (c) depicts the difference $\psi - \phi_{LS}$. It can be seen that a local measurement error $\epsilon$ (at a single pixel propagates throughout the imaging volume. As expected the $L_2$ cost function (6) has caused the impulsive error to propagate into neighboring cells.

This analysis demonstrates the importance of masking out inconsistent regions so that the error due to inconsistent regions will not propagate into neighboring regions. This problem may be overcome by determining the maximal consistent region $\Omega_C$ $\Omega$ in which the phase unwrapping is to be performed. However, as mentioned earlier, the task of determining $\Omega_C$ is difficult. In the following description, I continue with the previous approach and develop an alternative method.

Consider now the Poisson equation on reduced regions. The phase noise $n(\tau)$ depends on the MR signal strength corresponding to the position $\tau$. In regions of air, for instance, we expect zero MR signal and therefore the measured phase $\psi$ will be contaminated by a large phase noise. In regions of tissue, however, the SNR is expected to be high enough so that the consistency condition (5) holds. The objective is to unwrap the phase over the imaging volume $\Omega$ where sufficient MR signal is present. For this purpose, I segment the imaging volume $\Omega$ using the magnitude data. Let $$\Omega_S = \{\tau \epsilon \Omega : \sqrt{I^2(\tau) + Q^2(\tau)} > S\} \quad (14)$$

where I and Q are the in-phase and quadrature components used to obtain the phase measurement $\psi - \tan^{-1}[-Q/I]$, and S is a predetermined threshold. A robust phase unwrapping algorithm must unwrap the measured phase $\psi$ over $\Omega_S$, for a sufficiently low threshold S.

Once the imaging volume $\Omega$ is segmented to $\Omega_S$, I obtain the least squares phase, $\phi_{LS}$, by solving the following Poisson equation over a reduced domain, $\Omega_S$:

$$\nabla^2 \Omega = \nabla \cdot b_S \text{ on } \Omega_S \quad (15)$$

with one of boundary conditions, where $b_S = W[\nabla \psi] | \Omega_S$, the restriction of $W[\nabla \psi]$ to $\Omega_S$. Although the imaging volume $\Omega$ is usually rectangular and thus amendable to fast Poisson solvers, the segmented region $\Omega_S$ is not expected to be rectangular.

For irregular regions, such as $\Omega_S$, (15) may be solved by the method of embedding. For this technique, normal derivatives need to be computed on the boundary $\partial \Omega_S$. In addition, the technique requires a factorization of the capacitance matrix of size $N_C \times N_C$, where $N_C$ is the number of pixels on $\partial \Omega_S$. Depending on the size of $\partial \Omega_S$, i.e., $N_C$, the factorization of the capacitance matrix may be formidable and time consuming.

I have therefore developed an alternative method to solve (15). Consider the following Poisson equation over the imaging volume $\Omega$:

$$\nabla^2 \phi = \nabla \cdot b \text{ on } \Omega \quad (16)$$

with the same boundary condition as (15). It can be shown that there exists b defined on $\Omega$ such that the solution of (16) restricted to $\Omega_S$, is equivalent (to within a constant for the Neumann or free boundary conditions) to the solution of (15).

From the implementation point of view, the generation of b is trivial once the solution, $\phi$, to (16) is known. I simply set $b = \nabla \phi$. This suggests an iterative algorithm where b is updated iteratively using the solution of the previous iteration:

$$\nabla^2 \phi^{(k)} = \nabla \cdot b^{(k)} \text{ on } \Omega \quad (17)$$

with an appropriate boundary condition, where $$b^{(k+1)} = \begin{cases} b_S & \text{on } \Omega_S \\ \nabla \phi^{(k)} & \text{on } \Omega - \Omega_S \end{cases} \quad (18)$$

In the following, the above algorithm is integrated into a relation technique so that the phase is unwrapped over a region larger than $\Omega_S$.

In Equation (14), if the threshold S is set sufficiently high, then the consistency condition (5) will be satisfied over $\Omega_S$. Therefore, to maximize the region to be unwrapped, it is tempting to set the threshold S to the smallest number, such that the consistency condition (5) is satisfied on $\Omega_S$ as defined by (14). However, in practice, such threshold S is usually too high. In many applications, it is desired and sometimes required to unwrap the phase in regions with lower signal magnitude than S.

I develop a relaxation technique so that the phase in low SNR regions, i.e., regions outside of $\Omega_S$, is also unwrapped. Consider the following sequence of thresholds:

$$S_1 \leq S_2 \leq \ldots \leq S_L = S \quad (19)$$

and the sequence of associated regions $$\Omega_{S1} \quad \Omega_{S2} \quad \ldots \quad \Omega_{SL} = \Omega_S$$

In practice, $S_1$ is set to the lowest magnitude over the regions where we wish to unwrap, and $S_L$ is set sufficiently high so that the region $\Omega_{SL}$ is consistent.

The proposed algorithm proceeds as follows. The $L_2$ cost (6) is minimized over $\Omega_{S1}$ using (17) with initial $\phi^{(0)} = 0$. Then, on the next iteration, (6) is minimized over the next region $\Omega_{S2}$ using (17) over $\Omega_{S2}$ but with the initial $\phi^{(0)}$ set to the phase of the previous iteration. The process is repeated until the final least squares phase $\phi_{LS}$ is computed using the region $\Omega_{SL}$.

By combining the inner and outer iterations, the full algorithm can be summarized as Initialize $\phi^{(0)} = 0$.
For $l = 1, \ldots, L$, solve:

$$\nabla^2 \phi^{(l)} = \nabla \cdot b^{(l)} \text{ on } \Omega \quad (20)$$

with an appropriate boundary condition, where $$b^{(l+1)} = \begin{cases} b_S & \text{on } \Omega_{Sl} \\ \nabla \phi^{(l)} & \text{on } \Omega - \Omega_{Sl} \end{cases}$$

End. The resulting phase $\phi^{(L)}$ is the least squares phase $\phi_{LS}$.

While I have not made a full connection, the method above can be described using the terminology of simulated annealing.

By virtue of the $L_2$ cost (6), the threshold $S_L$ represents the lowest energy state that corresponds to the "freezing temperature". Furthermore, the sequence of thresholds $S_l$ $l=1,2,\ldots,L$, can associated with the sequence of energy states where the minimum energy of the state $l$ is given by:

$$\int_{\Omega_{S_l}} (\nabla\phi - W[\nabla\psi]) \cdot (\nabla\phi - W[\nabla\psi]) d\Omega$$

where $d\Omega = dx\,dy\,dz$. Therefore, the sequence $S_l$, $l=1,2,\ldots,L$, plays the role of the "temperature" of simulated annealing.

In stochastic relaxation methods, "annealing schedules" (or the sequence of predetermined temperatures) are generally established ad hoc. I have experimented with various schedules, including linear and logarithmic. The "optimum" schedule for our application has not been found and remains a topic of ongoing research. However, as suggested by the "Annealing Theorem", the logarithmic schedule has robustly served our current needs.

Consider now the method of determining the absolute phase from the least squares phase. For the case where $\phi$ is prescribed on the boundary $\partial\Omega_S$, the solution of (15) with the Dirichlet boundary condition results in a unique least squares phase $\phi_{LS}$. However, in general, the knowledge of $\phi$ on the boundary $\partial\Omega_S$ is not available and in this case I use either the Neumann boundary condition or the free boundary condition. For these boundary conditions, the least squares phase can only be determined up to an integration constant.

Therefore, once the least squares phase, $\phi_{LS}$, is obtained, I first determine the integration constant $\phi_{DC}$ as:

$$\phi_{DC} = \frac{\int_{\Omega_S} W[\psi - \phi_{LS}] d\Omega}{\int_{\Omega_S} d\Omega}$$

where $d\Omega = dx\,dy\,dz$. Another approach for determining the integration constant $\phi_{DC}$ we have used with success is to choose $\phi_{DC}$ to minimize the region (within $\Omega_S$) where $$|\nabla(\phi_{LS}+\phi_{DC})| > \pi.$$

For the case where the noise $n(r)=0$, the sum $\phi_{LS}+\phi_{DC}$ is a perfect reconstruction of the true phase $\phi$. However in the presence of noise, $$\phi_{LS}+\phi_{DC} \neq \psi + 2\pi k.$$

therefore, I present the following to estimate the absolute phase:

$$\phi = \phi_{LS} + \phi_{DC} + W[\psi - (\phi_{LS}+\phi_{DC})] \quad (21)$$

which takes $(\phi_{LS}+\phi_{DC})$ to the nearest $(\psi + 2\pi k)$ from $\psi$ so that $\phi = \psi + 2\pi k$.

Following are details of the implementation and the results obtained using the phase unwrapping algorithm. Examples are drawn from in vivo MR images acquired on a 1.5 T system (Signa, GE Medical Systems, Milwaukee, Wis.).

The proposed phase unwrapping algorithm (20) consists of the solution of the Poisson equation where the bulk of the computation is involved. Fortunately, the numerical solution of the Poisson equation is well developed and can be implemented efficiently for a certain class of discrete Laplacians.

I discretize the spatial derivatives using forward and backward-differencing schemes. This results in the conventional 5-point Laplacian mask (7-point for 3-D). Using this approach, the Poisson equation (17) can be solved by cosine transforms (assuming the Neumann boundary condition) which can be efficiently implemented by a series of fast Fourier transforms.

FIG. 5 shows some in vivo MR images. The top row shows magnitude images at different window/level settings. The original phase image (lower left) was unwrapped using the proposed algorithm (lower right). When necessary, the algorithm places certain branch cuts automatically where the magnitude is small (see arrow).

FIG. 6 shows MR breast images. As before, the top row shows magnitude images at different window/level settings. The algorithm robustly unwraps the phase even in regions of relatively low SNR (see arrows).

Lastly, I demonstrate an application of this technique to the three-point Dixon water/fat separation method. This method acquires three images, so that at each pixel in the image, $S_0 = (W+f)\,e^{j\delta_0}$
$S_1 = (W-f)\,e^{j(\delta+\delta_0)}$
$S_{-1} = (W-f)\,e^{-j(\delta-\delta_0)}$ where $w$ and $f$ are amplitudes of the water and fat components, $\delta_0$ is a phase shift present in all measurements, and $\delta$ is the $B_0$ field error phase term.

The common phase error $\delta_0$ can be removed to yield:
$S_0' = (W+f)$
$S_1' = (W-f)\,e^{j\delta}$
$S_{-1}' = (W-f)\,e^{-j\delta}$ Then, the phase of $(S'_1/S_{-1})$ is unwrapped. Using the unwrapped phase $\phi$, we have:

$W+f = S_0'$
$W-f = 0.5(S_1'e^{-j\phi/2} + S_{-1}'e^{j\phi/2})$ which can be solved for $w$ and $f$. Note that the phase unwrapping is necessary due to the factor $\frac{1}{2}$ in the phase term.

Figure 7C:
FIGS. 7(a)-7(c) illustrate the three-point Dixon water/fat separation technique for three adjacent sagittal images including $B_0$ field map 6(a), water 6(b) and fat images 6(c).
Figure 7B:
Figure 7A:

FIG. 7 shows three adjacent sagittal images of the $B_0$ phase map (left), and water/fat (middle/right) components. Nearly perfect reconstruction of the true $B_0$ phase map results in accurate separation of water and fat components.

Unlike previous approaches, the proposed algorithm is multi-dimensional. I have demonstrated the algorithm in 2-D; for applications requiring full 3-D phase unwrapping, the proposed algorithm would simply solve the Poisson equation in 3-D.

All images were obtained in one to sixteen iterations—solving the 2-D Poisson equation (16) 1 to 16 times. For images requiring eight iterations, our prototype algorithm implemented in MATLAB running on a Sun-SPARC 2 took approximately 15 minutes to complete. One iteration consists of a pair of cosine transforms, which can be executed in seconds on an array processor. Therefore, the computational requirement of the proposed algorithm appears to be within limits of clinical setting.

The proposed algorithm is not perfect. There are phase images that the algorithm fails to unwrap. I feel, however, with a carefully designed "annealing schedule", i.e., the sequence of thresholds (19), the algorithm should be able to unwrap most phase images encountered in MR applications. The optimum sequence of thresholds, slow enough for convergence but fast enough for practical applications, is a subject of further research.

In spatial regions that are narrow, it is difficult for the discrete solution to the Poisson equation to keep the coherence through the length of the region. This problem may be overcome by using the magnitude weighted cost:

$$\| M(\nabla\phi - W[\nabla\psi]) \|_2^2 \qquad (22)$$

where $$M (= \sqrt{I^2 + Q^2}\,)$$

is the magnitude image associated with the phase image $\psi$. The variance in the phase image can be shown to be inversely proportional to $M^2$. Therefore, assuming uncorrelated phase noise, (22) is the conventional objective function found in estimation theory.

It can be shown that the minimizer of (22) can be obtained by solving the linear system $Ax=b$. Unfortunately, the system matrix A is positive semi-definite, and the conjugate gradient and related algorithms cannot be used in this case. Specially designed algorithms such as Luenberger's hyperbolic pairs method must be used to accommodate singular direction vectors during the iteration. Although the minimizer of (22) may be superior to the minimizer of (6), especially for images containing narrow regions, its practicality may be limited due to the slow convergence of the iterative algorithm to solve $Ax=b$.

For applications where the magnitude image is not available, the sequence of thresholds, $S_l$, $l = 1, \ldots, L$ may be replaced by the sequence of sample variances $\sigma_l^2$. Then, the associated regions $\Omega_{\sigma_l 2}$ may be determined by:

$$\Omega_{\sigma_l 2} = \{\tau \in \Omega: \text{sample variance at } \tau > \sigma_l^2\}, l = 1, \ldots, L$$

where the "sample variance" is computed by the usual method.

In conclusion, I have presented a phase unwrapping technique based on optimization principles. The minimum point (the least squares phase of the $L_2$ cost (6) was obtained by solving the Poisson equation. The least squares phase was then mapped to the absolute phase using (21). The algorithm was shown to be robust in the presence of noise in creating unwrapped phase difference images for field mapping applications such as three-point Dixon water and fat reconstruction.

While the invention has been described with reference to unwrapping MR images, the description is illustrative of the invention and is not to be construed as limiting the invention. For example, the invention can be applied to increasing the dynamic range of phase contrast velocity images. Thus various modifications and applications may occur to those skilled in the art without departing from the true scope and spirit of the invention as defined by the appended claims.

What is claimed is:

1. A method of processing magnetic resonance signals comprising the steps of a) placing an object in a magnetic field,
   b) exciting nuclei spins in said object with an RF magnetic signal oriented at an angle with respect to said magnetic field,
   c) obtaining magnetic resonance signals representative of said nuclei spins, said signals having a wrapped noisy phase associated therewith, and
   d) determining absolute phase of said signals from said wrapped noisy phase using a Poisson equation and a least squares phase solution to said equation, and mapping said least square phase to absolute phase.

2. The method as defined by claim 1 wherein said Poisson equation is $$\nabla^2 \phi = \nabla \cdot W[\nabla\psi] \text{ on } \Omega$$

with appropriate boundary conditions, and where
   $\nabla\phi$ is the gradient of absolute phase
   $\nabla\psi$ is the gradient of measured phase
   W is a phase wrapping operator
   $\Omega$ is the imaging volume.

3. The method as defined by claim 1 wherein said least squares phase solution includes segmenting said imaging volume $\Omega$ to $\Omega_S$, and solving a Poisson equation over said reduced domain, $\Omega_S$ as follows:

$$\nabla^2 \phi = \nabla \cdot b_S \text{ on } \Omega_S$$

with appropriate boundary conditions, where $b_S$ is $W[\nabla\psi] | \Omega_S$ and $\Omega_S$ is the region where the signal magnitude is greater than S.

4. The method as defined by claim 3 wherein $\phi$ is updated iteratively using a solution to a previous iteration as follows:

$$\nabla^2 \phi^{(k)} = \nabla \cdot b^{(k)} \text{ on } \Omega$$

with appropriate boundary conditions, where $$b^{(k+1)} = \begin{cases} b_S & \text{on } \Omega_S \\ \nabla\phi^{(k)} & \text{on } \Omega - \Omega_S. \end{cases}$$

5. The method as defined by claim 1 wherein said least squares phase solution includes segmenting said imaging volume $\Omega$ to a sequence of regions, $$\Omega_{S1}, \Omega_{S2}, \ldots, \Omega_{SL}$$

where $$\Omega_{Sk} = \begin{cases} \text{region of } \Omega \text{ where the signal} \\ \text{magnitude is greater than } S_k \end{cases}$$

$$S_1 \leq S_2 \leq \ldots \leq S_L,$$

and solving a Poisson equation over a said sequence of domains $\Omega_{Sk}$ as follows:

$$b^{(k+1)} = \begin{cases} W[\nabla\psi] | \Omega_{Sk} & \text{on } \Omega_{Sk} \\ \nabla\phi^{(k)} & \text{on } \Omega - \Omega_{Sk} \end{cases}$$

with appropriate boundary conditions.

6. The method as defined by claim 1 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $$\phi_{DC} = \frac{\int_{\Omega_S} W[\psi - \phi_{LS}]d\Omega}{\int_{\Omega_S} d\Omega}$$

where $d\Omega = dx\, dy\, dz$.

7. The method as defined by claim 1 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $\phi_{DC}$ is chosen to minimize a region within $\Omega_S$ where $$|\nabla(\phi_{LS} + \phi_{DC})| > \pi.$$

8. Apparatus for processing magnetic resonance signals comprising
   a) means for establishing a magnetic field through an object,
   b) means for exciting nuclei spins in said object with an RF magnetic signal oriented at an angle with respect to said magnetic field,
   c) means for obtaining magnetic resonance signals representative of said nuclei spins, said signals having a wrapped noisy phase associated therewith, and
   d) means for determining absolute phase of said signals from said wrapped noisy phase using a Poisson equation and a least squares phase solution to said equation, and mapping said least square phase to absolute phase.

9. Apparatus as defined in claim 8 wherein element (d) uses a Poisson equation as follows:

$$\nabla^2\phi = \nabla \cdot W[\nabla\psi] \text{ on } \Omega$$

with appropriate boundary conditions, where
   $\nabla\phi$ is the gradient of absolute phase
   $\nabla\psi$ is the gradient of measured phase
   W is a phase wrapping operator
   $\Omega$ is the imaging volume 10. Apparatus as defined by claim 8 wherein element (d) uses a least squares phase solution including segmenting said imaging volume $\Omega$ to $\Omega_S$, and solving a Poisson equation over said reduced domain, $\Omega_S$ as follows:

$$\nabla^2\phi = \nabla \cdot b_S \text{ on } \Omega_S$$

with appropriate boundary conditions, where $b_S$ is $W[\nabla\psi]|_{\Omega_S}$ and $\Omega_S$ is the region where the signal magnitude is greater than S.

11. Apparatus as defined by claim 10 wherein $\phi$ is updated iteratively using a solution to a previous iteration as follows:

$$\nabla^2\phi^{(k)} = \nabla \cdot b^{(k)} \text{ on } \Omega$$

with appropriate boundary conditions, where $$b^{(k+1)} = \begin{cases} b_S & \text{on } \Omega_S \\ \nabla\phi^{(k)} & \text{on } \Omega - \Omega_S. \end{cases}$$

12. Apparatus as defined in claim 11 wherein said least squares phase solution includes segmenting said imaging volume $\Omega$ to a sequence of regions, $$\Omega_{S1}, \Omega_{S2}, \ldots, \Omega_{SL}$$

where $$\Omega_{Sk} = \left\{ \begin{array}{l} \text{region of } \Omega \text{ where the signal} \\ \text{magnitude is greater than } S_k \end{array} \right.$$

$$S_1 \leq S_2 \leq \ldots \leq S_L,$$

and solving a Poisson equation over a said sequence of domains $\Omega_{Sk}$ as follows:

$$\nabla^2\phi^{(k)} = \nabla \cdot b^{(k)}$$

$$b^{(k+1)} = \begin{cases} W[\nabla\psi]|_{\Omega_{Sk}} & \text{on } \Omega_{Sk} \\ \nabla\phi^{(k)} & \text{on } \Omega - \Omega_{Sk} \end{cases}$$

with appropriate boundary conditions.

13. Apparatus as defined by claim 8 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $$\phi_{DC} = \frac{\int_{\Omega_S} W[\psi - \phi_{LS}]d\Omega}{\int_{\Omega_S} d\Omega}$$

where $d\Omega = dx\, dy\, dz$.

14. Apparatus as defined by claim 8 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $\phi_{DC}$ is chosen to minimize a region within $\Omega_S$ where $$|\nabla(\phi_{LS} + \phi_{DC})| > \pi.$$

15. A method of processing multidimensional phase signals to obtain absolute phase from a wrapped noisy phase comprising the steps of
   determining absolute phase of said phase of said signals from said wrapped noisy phase using a Poisson equation and a least squares phase solution to said equation, and mapping said least square phase to absolute phase, where said Poisson equation is $$\nabla^2 \phi = \nabla \cdot W[\nabla \psi] \text{ on } \Omega$$

with appropriate boundary conditions, where $\nabla \phi$ is the gradient of absolute phase $\nabla \psi$ is the gradient of measured phase W is a phase wrapping operator $\Omega$ is the imaging volume.

16. The method as defined by claim 15 wherein said least squares phase solution includes segmenting said imaging volume $\Omega$ to a sequence of regions, $$\Omega_{S1}, \Omega_{S2}, \ldots, \Omega_{SL}$$

where $$\Omega_{Sk} = \begin{cases} \text{region of } \Omega \text{ where the signal} \\ \text{magnitude is greater than } S_k \end{cases}$$

$S_1 \leq S_2 \leq \ldots \leq S_L,$ and solving a Poisson equation over a said sequence of domains $\Omega_{Sk}$ as follows:

$$b^{(k+1)} = \begin{cases} W[\nabla \psi] | \Omega_{Sk} & \text{on } \Omega_{Sk} \\ \nabla \phi^{(k)} & \text{on } \Omega - \Omega_{Sk} \end{cases}$$

with appropriate boundary conditions.

17. The method as defined by claim 15 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $$\phi_{DC} = \frac{\int_{\Omega_S} W[\psi - \phi_{LS}] d\Omega}{\int_{\Omega_S} d\Omega}$$

where $d\Omega = dx\, dy\, dz$.

18. The method as defined by claim 15 wherein the absolute phase, $\phi$, is obtained from the least squares phase, $\phi_{LS}$, according to the relationship $$\phi = \phi_{LS} + \phi_{DC} + W[\psi - (\phi_{LS} + \phi_{DC})]$$

where $\phi_{DC}$ is chosen to minimize a region within $\phi_S$ where $$|\nabla(\phi_{LS} + \phi_{DC})| > \pi.$$

* * * * *